US009568371B2

(12) United States Patent
Tari et al.

(10) Patent No.: US 9,568,371 B2
(45) Date of Patent: Feb. 14, 2017

(54) INFRARED SENSOR

(71) Applicant: MITSUBISHI MATERIALS CORPORATION, Tokyo (JP)

(72) Inventors: Kazuyoshi Tari, Naka (JP); Mototaka Ishikawa, Naka (JP); Keiji Shirata, Naka (JP); Kenzo Nakamura, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 160 days.

(21) Appl. No.: 14/375,065

(22) PCT Filed: Jan. 29, 2013

(86) PCT No.: PCT/JP2013/000467
§ 371 (c)(1),
(2) Date: Jul. 28, 2014

(87) PCT Pub. No.: WO2013/114861
PCT Pub. Date: Aug. 8, 2013

(65) Prior Publication Data
US 2014/0374596 A1 Dec. 25, 2014

(30) Foreign Application Priority Data

Feb. 1, 2012 (JP) ................................ 2012-019431

(51) Int. Cl.
*G01J 5/00* (2006.01)
*G01J 5/10* (2006.01)
(Continued)

(52) U.S. Cl.
CPC ................ *G01J 5/10* (2013.01); *G01J 5/0022* (2013.01); *G01J 5/06* (2013.01); *G01J 5/0803* (2013.01);
(Continued)

(58) Field of Classification Search
CPC ........................................................ G01J 5/10
See application file for complete search history.

(56) References Cited

U.S. PATENT DOCUMENTS 5,962,854 A    10/1999  Endo

FOREIGN PATENT DOCUMENTS

JP          07063585 A      3/1995
JP          H07260579 A    10/1995
(Continued)

OTHER PUBLICATIONS

English Language machine translation of JP 2011-013213.*
(Continued)

*Primary Examiner* — David Porta
*Assistant Examiner* — Edwin Gunberg
(74) *Attorney, Agent, or Firm* — Locke Lord LLP; Howard M. Gitten; James E. Armstrong, IV

(57) ABSTRACT

Provided is an infrared sensor which is capable of measuring a temperature of an object to be measured with high accuracy even when lead wires are connected to one side thereof. The infrared sensor includes an insulating film; a first and a second heat sensitive element which are provided on one face of the insulating film; a first and a second wiring film that are respectively connected to the first and the second heat sensitive element; an infrared reflecting film; a plurality of terminal electrodes; and a thermal resistance adjusting film which is provided on the other face of the insulating film, is in opposition to at least a portion of the longer one of the first or the second wiring film in wiring distance from the terminal electrodes, and is formed of a material with greater heat dissipation than the insulating film.

4 Claims, 2 Drawing Sheets

(51) Int. Cl.
  G01J 5/08 (2006.01)
  G01J 5/06 (2006.01)
  H05K 1/02 (2006.01)
  H01L 37/02 (2006.01)
  G01J 5/20 (2006.01)
  H01L 27/144 (2006.01)
  G03G 15/20 (2006.01)
  H05K 1/18 (2006.01)

(52) U.S. Cl.
  CPC ....... H05K 1/0271 (2013.01); *G01J 2005/103* (2013.01); *G01J 2005/206* (2013.01); *G03G 15/2039* (2013.01); *G03G 2215/00772* (2013.01); *H01L 27/144* (2013.01); *H01L 37/02* (2013.01); *H05K 1/189* (2013.01); *H05K 2201/068* (2013.01); *H05K 2201/09136* (2013.01); *H05K 2201/09781* (2013.01)

(56) References Cited

FOREIGN PATENT DOCUMENTS

| | | |
|---|---|---|
| JP | 2003-194630 A | 7/2003 |
| JP | 2011-013213 A | 1/2011 |
| JP | 2011-102791 A | 5/2011 |
| WO | WO-2011046163 A1 | 4/2011 |
| WO | WO-2011078004 A1 | 6/2011 |

OTHER PUBLICATIONS

Extended European Search Report for EP13743471.8 dated Sep. 2, 2015.
Chinese Office Action for CN Application No. 201380004514.8 dated Jul. 31, 2015.
International Search Report of PCT/JP2013/000467, dated May 14, 2013.

* cited by examiner (a)

(b)

INFRARED SENSOR

CROSS-REFERENCE TO RELATED APPLICATIONS

This application is a U.S. National stage application of PCT International Application No. PCT/JP2013/000467, filed Jan. 29, 2013, which claims the benefit of Japanese Patent Application No. 2012-019431 filed Feb. 1, 2012, the entire contents of the aforementioned applications are hereby incorporated herein by reference.

BACKGROUND OF THE INVENTION

Field of the Invention

The present invention relates to an infrared sensor that detects infrared radiation from an object to be measured to thereby measure the temperature of the object to be measured.

Description of the Related Art

Conventionally, infrared sensors have been used as temperature sensors that detect infrared radiation due to the radiation emitted from an object to be measured without contact to thereby measure the temperature of the object to be measured.

For example, Patent Document 1 discloses an infrared temperature sensor that includes a resin film that is disposed on a holder, a heat sensitive element for infrared detection that is provided on the resin film and detects infrared radiation via a light guide unit of the holder, and a heat sensitive element for temperature compensation that is provided on the resin film in a light-shielding state and detects the temperature of the holder. In the infrared temperature sensor, a plurality of lead wires is connected to the end of the resin film.

In addition, Patent Document 2 discloses a non-contact temperature sensor that includes a first casing through which an infrared radiation entrance aperture is formed; a second casing having an entrance aperture facing surface portion opposing to the entrance aperture; a base plate that is arranged between the first casing and the entrance aperture facing surface portion provided in the second casing, is attached to the first casing side of the entrance aperture facing surface portion, and performs thermal conversion of infrared radiation incident from the entrance aperture; and a first heat sensitive element that is provided on the base plate and is sensitive to the amount of heat transferred by infrared radiation. In the non-contact temperature sensor, the heat sensitive element is provided on the resin film, and a plurality of lead wires is connected to the ends of the resin film.

PRIOR ART DOCUMENTS

Patent Documents

[Patent Document 1] Japanese Unexamined Patent Application Publication. No. 2002-156284
[Patent Document 2] Japanese Unexamined Patent Application Publication No. 2006-118992

SUMMARY OF THE INVENTION

Problems to be Solved by the Invention

However, the following problems still remain in the conventional techniques described above.

In the conventional infrared sensor, a plurality of lead wires is connected to the same end of the resin film in order to bring the lead wires collected to a connector from one side for cost reduction. In this case, the wiring distances between a pair of heat sensitive elements and the connections of the lead wires are different from each other depending on the arrangement of the pair of heat sensitive elements. Consequently, the thermal conduction of the lead wires differs from each other, so that the sensitivity of the infrared sensor may vary depending on temperature. Specifically, the thermal resistances of wiring films having different length are different from each other, resulting in losing a thermal balance (balance of heat input) between a pair of heat sensitive elements. Thus, it is difficult to detect a temperature with accuracy using the pair of heat sensitive elements. It may be contemplated that the width of one wiring film having a longer wiring distance than that of the other wiring film is expanded in order to set the thermal resistances of both wiring films to the same level. However, if the width of one wiring film is expanded, the wiring film is readily brought into contact with the casing in which the infrared sensor is incorporated, resulting in an undesirable short-circuit.

The present invention has been made in view of the aforementioned circumstances, and an object of the present invention is to provide an infrared sensor that can measure the temperature of an object to be measured with high accuracy without losing a thermal balance even when lead wires are connected to one side thereof.

Means for Solving the Problems

The present invention adopts the following structure in order to solve the aforementioned problems. Specifically, an infrared sensor according to a first aspect of the present invention is characterized in that the infrared sensor includes an insulating film; a first heat sensitive element and a second heat sensitive element provided on one face of the insulating film so as to be spaced apart from one another; a first conductive wiring film and a second conductive wiring film that are formed on one surface of the insulating film and are respectively connected to the first heat sensitive element and the second heat sensitive element; an infrared reflecting film provided on the other face of the insulating film so as to face the second heat sensitive element; a plurality of terminal electrodes which are provided on the same end side of the insulating film and are connected to the corresponding first wiring film and second wiring film; and a thermal resistance adjusting film which is provided on the other face of the insulating film, is in opposition to at least a portion of the longer one of the first wiring film or the second wiring film in wiring distance from the terminal electrodes, and is formed of a material with greater heat dissipation than the insulating film.

Since the infrared sensor includes a thermal resistance adjusting film which is provided on the other face of the insulating film, is in opposition to at least a portion of the longer one of the first wiring film or the second wiring film in wiring distance from the terminal electrodes, and is formed of a material with greater heat dissipation than the insulating film, the thermal resistance of one wiring film having a longer wiring distance than that of the other wiring film can be adjusted depending on the arrangement, shape, and area of the thermal resistance adjusting film, and thus, the thermal resistance of one wiring film can be set to be the same level as that of the other wiring film, resulting in obtaining a favorable thermal balance. Specifically, the thermal resistance adjusting film which is formed of a material such as a metal film with greater heat dissipation than the insulating film serves as a heat dissipating plate for heat dissipation depending on the arrangement, shape, and area of one wiring film having a longer wiring distance than that of the other wiring film, so that the balance of heat input can be adjusted. Thus, a thermal resistance can be balanced between a pair of heat sensitive elements with respect to the lead wires connected to the terminal electrodes, resulting in an improvement in temperature characteristics. Since the width of the wiring film does not need to be expanded, there is no risk of a short circuit caused by contact between the wiring film and the casing. Furthermore, since the thermal resistance adjusting film is formed on the other face of the insulating film on the opposite side to the wiring film, the degree of freedom in design such as the arrangement position, shape, area, or the like of the thermal resistance adjusting film is high and the thermal resistance adjusting film is electrically insulated from the wiring film by the insulating film, resulting in no risk of a short circuit.

An infrared sensor according to a second aspect of the present invention is characterized in that the thermal resistance adjusting film is patterned using the same material as that of the infrared reflecting film according to the first aspect of the present invention.

Specifically, since, in the infrared sensor, the thermal resistance adjusting film is patterned using the same material as that of the infrared reflecting film, the thermal resistance adjusting film can be simultaneously patterned during deposition of the infrared reflecting film, resulting in a reduction in manufacturing steps.

An infrared sensor according to a third aspect of the present invention is characterized in that the first wiring film is disposed around the first heat sensitive element and is formed to have a larger area than that of the second wiring film and the thermal resistance adjusting film is formed excluding an area opposed to a portion disposed around the first heat sensitive element of the first wiring film according to the first or the second aspect of the present invention.

Specifically, since, in the infrared sensor, the first wiring film is disposed around the first heat sensitive element and is formed to have a larger area than that of the second wiring film, the first wiring film having a large area blocks infrared radiation which is irradiated on the casing and the mounting substrate by passing through the insulating film and also blocks radiation heat radiated from the casing and the mounting substrate, so that the insulating film may be prevented from being thermally affected. Furthermore, the first wiring film improves heat collection from a portion of the insulating film at which infrared radiation has been absorbed and a heat capacity of the first wiring film becomes close to that of a portion at which the infrared reflecting film for the insulating film is formed, resulting in a reduction in variation error. Thus, the infrared sensor sensitively reacts to ambient temperature fluctuation, and thus, exhibits excellent followability between a portion affected by radiation heat and a portion unaffected by radiation heat, resulting in a further improvement in detection accuracy. It is preferable that the area and the shape of the first wiring film are set such that the heat capacity of the first wiring film is substantially the same as that of a portion at which the infrared reflecting film for the insulating film is formed.

Furthermore, since the longer one of the first wiring film or the second wiring film in wiring distance is the first wiring film and the thermal resistance adjusting film is formed excluding an area opposed to a portion disposed around the first heat sensitive element of the first wiring film, the adverse effect caused by the thermal resistance adjusting film can be suppressed when a heat capacity of a portion at which the infrared reflecting film is formed is adjusted by a portion which is disposed around the first heat sensitive element.

Effects of the Invention

According to the present invention, the following effects may be provided.

Specifically, since the infrared sensor of the present invention includes a thermal resistance adjusting film which is provided on the ocher face of the insulating film and is in opposition to at least a portion of the longer one of the first wiring film or the second wiring film in wiring distance from the terminal electrodes, the thermal resistance of one wiring film can be set to be the same level as that of the other wiring film, resulting in obtaining a favorable thermal balance.

Thus, since the infrared sensor of the present invention can measure the temperature of an object to be measured with high accuracy even when lead wires are connected to one side thereof, the infrared sensor of the present invention is readily installed in an elongated area, and is particularly preferably used as a temperature sensor which is used for detecting a temperature of a fixing roller of a copier or the like having an elongated structure.

BRIEF DESCRIPTION OF THE DRAWINGS

FIG. 1(*b*) is a plan view illustrating an infrared sensor with a heat sensitive element removed therefrom according to one embodiment of the infrared sensor of the present invention.

BEST MODES FOR CARRYING OUT THE INVENTION

Figure 1:
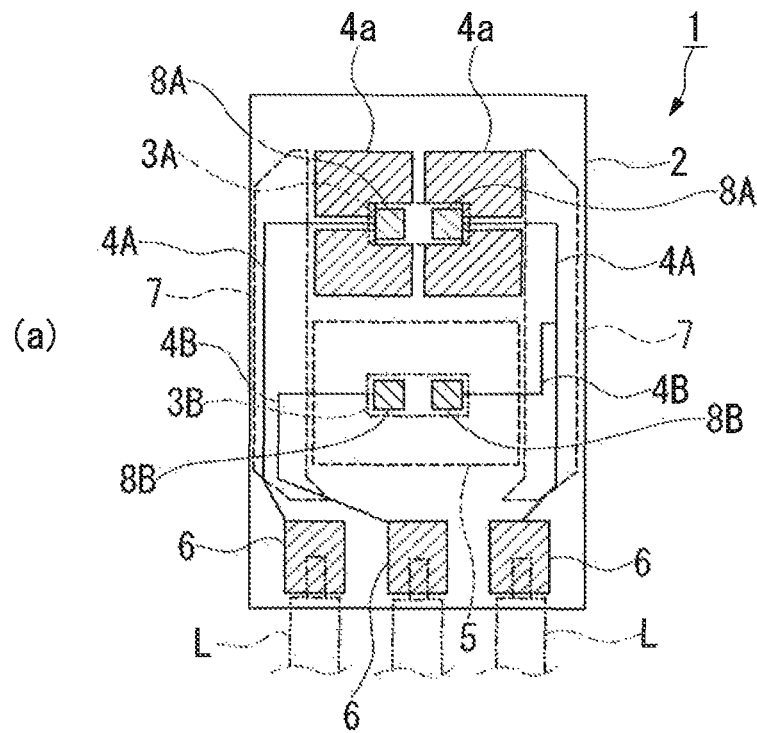
FIG. 1(*a*) is a rear view illustrating an infrared sensor with a heat sensitive element removed therefrom according to one embodiment of the infrared sensor of the present invention.
Figure 1:
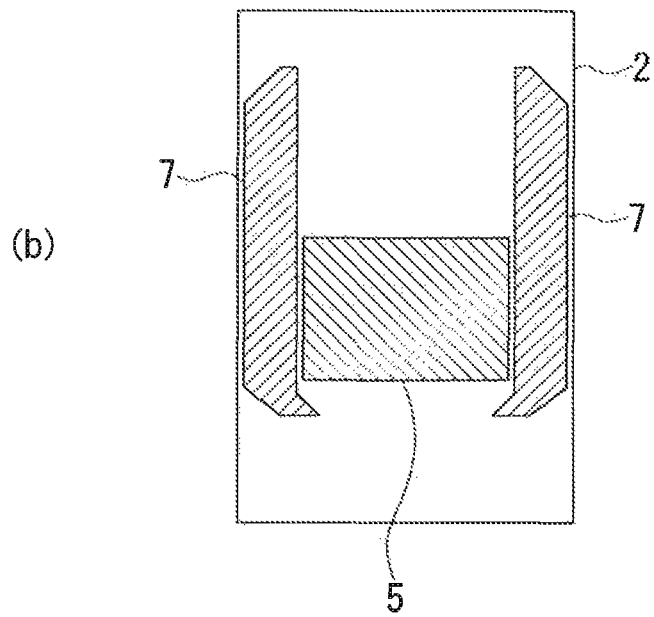

Hereinafter, a description that will be given of an infrared sensor according to one embodiment of the present invention with reference to FIGS. 1 to 3. In the drawings used in the following description, the scale of each component is changed as appropriate so that each component is recognizable or is readily recognized.

Figure 2:
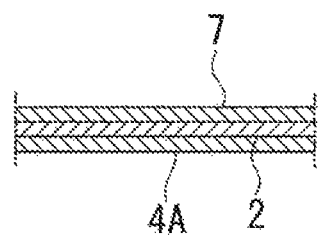
FIG. 2 is a cross-sectional view illustrating the essential parts cut along a first wiring film according to the present embodiment.
Figure 3:
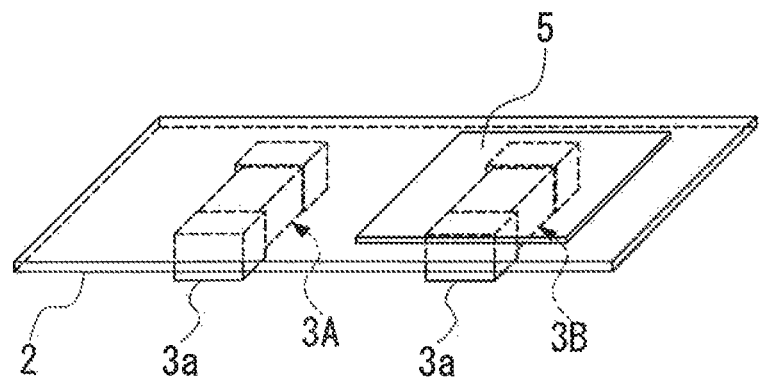
FIG. 3 is a perspective view simply illustrating an insulating film with a heat sensitive element adhered thereto according to the present embodiment.

As shown in FIGS. 1 to 3, an infrared sensor (1) of the present embodiment includes an insulating film (2); a first heat sensitive element (3A) and a second heat sensitive element (3B) provided on one face (bottom face of rear face) of the insulating film (2) so as to be spaced apart from one another; a first conductive wiring film (4A) connected to the first heat sensitive element (3A) and a second conductive wiring film (4B) connected to the second heat sensitive element (3B), both wiring films being patterned by copper foil or the like on one face of the insulating film (2); an infrared reflecting film (5) which is provided on the other face of the insulating film (2) so as to face the second heat sensitive element (3B); a plurality of terminal electrodes (6) which are provided on the same end side of the insulating film (2) and are connected to the corresponding first wiring film (4A) and second wiring film (4B); and a thermal resistance adjusting film (7) which is provided on the other face of the insulating film (2), is in opposition to at least a portion of the longer one of the first wiring film (4A) or the second wiring film (4B) in wiring distance from the terminal electrodes (6), and is formed of a material with greater heat dissipation than the insulating film (2).

As shown in FIGS. 1 and 2, the first wiring films (4A) have wider portions (4*a*) which are disposed around the first heat sensitive element (3A) and are patterned to have a larger area than that of the second wiring films (4B). These first wiring films (4A) have the first heat sensitive element (3A) disposed at the center of the pair of wider portions (4*a*), the outer shape of the pair of wider portions (4*a*) is set to have substantially the same square outer shape as that of the infrared reflecting film (5). Specifically, the area and the shape of the first wiring film (4A) are set such that the first wiring film (4A) has substantially the same heat capacity as that of a portion in which the infrared reflecting film (5) is formed on the insulating film (2). In FIG. 1, portions patterned by a metal foil, such as the infrared reflecting film (5) or the like, are illustrated by hatching.

The pair of first wiring films (4A) is connected to a pair of first adhesion electrodes (8A) patterned on the insulating film (2) on one end thereof and is connected to the terminal electrodes (6) patterned on the insulating film (2) on the other end thereof.

Also, the pair of second wiring films (4B) is formed in the shape of a line or a band, is connected to a pair of second adhesion electrodes (8B) patterned on the insulating film (2) on one end thereof, and is connected to the terminal electrodes (6) patterned on the insulating film (2) on the other end thereof.

Note that the chip terminal electrodes (3*a*) of the first heat sensitive element (3A) and the second heat sensitive element (3B) are adhered to the first adhesion electrodes (8A) and the second adhesion electrodes (8B), respectively, via a conductive adhesive such as solder.

The terminal electrodes (6) are connected to the corresponding lead wires (L) via a conductive adhesive such as solder.

The number of terminal electrodes (6) is three: the first one is connected to one of the first wiring films (4A), the second one is connected to one of the second wiring films (4B), and the third one is connected to the other one of the first wiring films (4A) and the other one of the second wiring films (4B).

The insulating film (2) is formed of a polyimide resin sheet. The infrared reflecting film (5), the thermal resistance adjusting film (7), the first wiring films (4A), and the second wiring films (4B) are formed by copper foil. Specifically, a double-sided flexible substrate is produced such that the infrared reflecting film (5), the thermal resistance adjusting film (7), the first wiring films (4A), and the second wiring films (4B) are patterned by copper foil on both sides of the polyimide substrate serving as the insulating film (2).

Furthermore, as shown in FIG. 1, the infrared reflecting film (5) is arranged in a square shape immediately above the second heat sensitive element (3B) and is constituted of a copper foil and a gold-plated film deposited on the copper foil.

The infrared reflecting film (5) is formed of a material having higher infrared reflectivity than that of the insulating film (2) and is constituted of a copper foil and a gold-plated film deposited on the copper foil as described above. Instead of the gold-plated film, a mirror finished aluminum vapor-deposited film, an aluminum foil, or the like may also be deposited on the copper foil. The infrared reflecting film (5) has a greater size than that of the second heat sensitive element (33) so as to cover the second heat sensitive element (3B).

As shown in FIG. 3, each of the first heat sensitive element (3A) and the second heat sensitive element (3B) is a chip thermistor in which the chip terminal electrodes (3*a*) are formed on both ends thereof. Examples of such a thermistor include an NTC type thermistor, a PTC type thermistor, a CTR type thermistor, and the like. In the present embodiment, an NTC type thermistor is employed as each of the first heat sensitive element (3A) and the second heat sensitive element (3B). The thermistor is formed of a thermistor material such as a Mn—Co—Cu-based material, a Mn—Co—Fe-based material, or the like.

In particular, in the present embodiment, a ceramic sintered body containing Mn, Co and Fe metal oxides, i.e., a thermistor element formed of a Mn—Co—Fe-based material is employed as the first heat sensitive element (3A) and the second heat sensitive element (3B). Furthermore, it is preferable that the ceramic sintered body has a crystal structure in which the main phase is a cubic spinel phase. In particular, it is most preferable that the ceramic sintered body has a crystal structure having a single phase consisting of a cubic spinel phase.

In the present embodiment, the first heat sensitive element (3A) is disposed further away from the terminal electrodes (6) than the second heat sensitive element (3B), and the first wiring film (4A) is set to have a longer wiring distance than that of the second wiring film (4B).

The thermal resistance adjusting film (7) is formed excluding an area opposed to a portion (wider portion (4*a*)), which is disposed around the first heat sensitive element (3A), of the first wiring film (4A). Specifically, the thermal resistance adjusting film (7) has a pair of substantially trapezoidal-shaped patterns extending from both sides of the wider portion (4*a*) to the end side on which the terminal electrodes (6) are formed.

The thermal resistance adjusting film (7) may be formed of a material with greater heat dissipation than the insulating film (2). In particular, in the present embodiment, the thermal resistance adjusting film (7) is patterned using the same material as that of the infrared reflecting film (5). Specifically, the thermal resistance adjusting film (7) is a floating electrode which is constituted of a copper foil and a gold-plated film deposited on the copper foil and is electrically floating with respect to the wiring film without being connected therewith.

As described above, since the infrared sensor (1) of the present embodiment includes the thermal resistance adjusting film (7) which is provided on the other face of the insulating film (2) and is in opposition to at least a portion of the longer one of the first wiring film (4A) or the second wiring film (4B) in wiring distance from the terminal electrodes (6), the thermal resistance of one wiring film having a longer wiring distance than that of the other wiring film can be adjusted depending on the arrangement, shape, and area of the thermal resistance adjusting film (7), and thus, the thermal resistance of one wiring film can be set to be the same level as that of the other wiring film, resulting in obtaining a favorable thermal balance.

Specifically, the thermal resistance adjusting film (7) which is formed of a metal film or the like serves as a heat dissipating plate for heat dissipation depending on the arrangement, shape, and area of one wiring film having a longer wiring distance than that of the other wiring film, so that the balance of heat input can be adjusted. Thus, a thermal resistance can be balanced between a pair of heat sensitive elements (3A) and (3B) with respect to the lead wires (L) connected to the terminal electrodes (6), resulting in an improvement in temperature characteristics.

Since the width of the wiring film does not need to be expanded, there is no risk of a short circuit caused by contact between the wiring film and the casing for housing the infrared sensor (1). Furthermore, since the thermal resistance adjusting film (7) is formed on the other face of the insulating film on the opposite side to the wiring films (4A) and (4B), the degree of freedom in design such as the arrangement position, shape, area, or the like of the thermal resistance adjusting film (7) is high and the thermal resistance adjusting film (7) is electrically insulated from the wiring films (4A) and (4B) by the insulating film (2), resulting in no risk of a short circuit.

Furthermore, since the thermal resistance adjusting film (7) is patterned using the same material as that of the infrared reflecting film (5), the thermal resistance adjusting film (7) can be simultaneously patterned during deposition of the infrared reflecting film (5), resulting in a reduction in manufacturing steps.

Since the first wiring film (4A) is disposed around the first heat sensitive element (3A) and is formed to have a larger area than that of the second wiring film (4B), the first wiring film (4A) having a large area blocks infrared radiation which is irradiated on the casing and the mounting substrate by passing through the insulating film (2) and also blocks radiation heat radiated from the casing and the mounting substrate, so that the insulating film (2) may be prevented from being thermally affected. Furthermore, the first wiring film (4A) improves heat collection from a portion of the insulating film (2) at which infrared radiation has been absorbed and a heat capacity of the first wiring film (4A) becomes close to that of a portion in which the infrared reflecting film (5) is formed on the insulating film (2), resulting in a reduction in temperature variation error.

Thus, the infrared sensor (1) sensitively reacts to ambient temperature fluctuation, and thus, exhibits excellent followability between a portion affected by radiation heat and a portion unaffected by radiation heat, resulting in a further improvement in detection accuracy. It is preferable that the area and the shape of the first wiring film (4A) is set such that the heat capacity of the first wiring film (4A) is substantially the same as that of a portion in which the infrared reflecting film (5) is formed on the insulating film (2).

Furthermore, since the thermal resistance adjusting film (7) is formed excluding an area opposed to a portion disposed around the first heat sensitive element (3A) of the first wiring film (4A), the adverse effect caused by the thermal resistance adjusting film (7) can be suppressed when a heat capacity of a portion at which the infrared reflecting film (5) is formed is adjusted by a portion which is disposed around the first heat sensitive element (3A).

The technical scope of the present invention is not limited to the aforementioned embodiments, but the present invention may be modified in various ways without departing from the scope or teaching of the present invention.

For example, while, in the above embodiments, the first heat sensitive element detects the heat conducted from the insulating film that has directly absorbed infrared radiation, an infrared absorbing film may also be formed on the insulating film directly above the first heat sensitive element. In this case, the infrared absorption effect obtained by the first heat sensitive element further improves, so that a favorable temperature difference can be obtained between the first heat sensitive element and the second heat sensitive element. Specifically, infrared radiation from the object to be measured may be absorbed by the infrared absorbing film so that the temperature of the first heat sensitive element directly below the insulating film may be adapted to be changed by heat conduction via the insulating film from the infrared absorbing film generated heat by infrared absorption.

The infrared absorbing film is formed of a material having a higher infrared absorptivity than that of the insulating film. As the infrared absorbing film, a film containing an infrared absorbing material such as carbon black or the like or an infrared absorbing glass film (borosilicate glass film containing 71% silicon dioxide) may be employed. In particular, it is preferable that the infrared absorbing film is an antimony-doped tin oxide (ATO) film. The ATO film exhibits excellent infrared absorptivity and excellent light resistance as compared with carbon black or the like. Also, the ATO film is cured by ultraviolet light so that strong bonding strength is obtained and the ATO film is not easily peeled off as compared with carbon black or the like.

It is preferable that the infrared absorbing film is formed to have a larger area than that of the first heat sensitive element so as to cover the first heat sensitive element. When the infrared absorbing film is provided, the area and the shape of each of the wiring films need to be set such that the heat capacity of the infrared absorbing film is substantially the same as that of the infrared reflecting film.

While a chip thermistor is employed as each of the first heat sensitive element and the second heat sensitive element, a thin-film thermistor may also be employed as each of the first heat sensitive element and the second heat sensitive element.

As described above, although a thin-film thermistor or a chip thermistor is used as a heat sensitive element, a pyroelectric element or the like may also be employed other than a thermistor.

REFERENCE NUMERALS

1: infrared sensor, 2: insulating film, 3A: first heat sensitive element, 3B: second heat sensitive element, 4A: first wiring film, 4B: second wiring film, 5: infrared reflecting film, 6: terminal electrode, 7: thermal resistance adjusting film, L: lead wire

What is claimed is:

1. An infrared sensor comprising:
    an insulating film;
    a first heat sensitive element and a second heat sensitive element provided on one face of the insulating film so as to be spaced apart from one another;
    a first conductive wiring film and a second conductive wiring film that are formed on one surface of the insulating film and are respectively connected to the first heat sensitive element and the second heat sensitive element;
    an infrared reflecting film provided on the other face of the insulating film so as to face the second heat sensitive element;
    a plurality of terminal electrodes which are provided on the same end side of the insulating film and are connected to the corresponding first wiring film and second wiring film; and
    a thermal resistance adjusting film which is provided on the other face of the insulating film, is in opposition to at least a portion of the longer one of the first wiring film or the second wiring film in wiring distance from the terminal electrodes, is formed of a material with greater heat dissipation than the insulating film, and adheres to the insulating film.

2. The infrared sensor according to claim 1, wherein the thermal resistance adjusting film is patterned using the same material as that of the infrared reflecting film.

3. The infrared sensor according to claim 1, wherein the first wiring film is disposed around the first heat sensitive element and is formed to have a larger area than that of the second wiring film, the longer one of the first wiring film or the second wiring film in wiring distance is the first wiring film, and the thermal resistance adjusting film is formed excluding an area opposed to a portion disposed around the first heat sensitive element of the first wiring film.

4. The infrared sensor according to claim 2, wherein the first wiring film is disposed around the first heat sensitive element and is formed to have a larger area than that of the second wiring film, the longer one of the first wiring film or the second wiring film in wiring distance is the first wiring film, and the thermal resistance adjusting film is formed excluding an area opposed to a portion disposed around the first heat sensitive element of the first wiring film.

* * * * *